United States Patent [19]

Hollister et al.

[11] Patent Number: 4,799,165

[45] Date of Patent: Jan. 17, 1989

[54] LEVEL DETECTING WAVEFORM SAMPLING SYSTEM

[75] Inventors: Allen L. Hollister, Beaverton; Edward L. Reuss, Aloha, both of Oreg.

[73] Assignee: Tektronix, Inc., Beaverton, Oreg.

[21] Appl. No.: 835,417

[22] Filed: Mar. 3, 1986

[51] Int. Cl.$^4$ .......................... G09G 1/00; H01J 29/98
[52] U.S. Cl. ............................... 364/487; 324/77 R; 364/179
[58] Field of Search ............... 364/487, 480, 481, 178, 364/179; 324/77 R, 79 D, 121 R

[56] References Cited

U.S. PATENT DOCUMENTS

| | | | |
|---|---|---|---|
| 4,065,664 | 12/1977 | Kristof et al. | 364/487 |
| 4,208,626 | 6/1980 | Gregg, Jr. | 324/79 D |
| 4,349,512 | 8/1983 | Soma et al. | 364/487 |
| 4,471,452 | 9/1984 | Borchert | 364/179 |
| 4,507,740 | 3/1985 | Star et al. | 364/487 |
| 4,540,982 | 9/1985 | Jalovec | 324/121 R |
| 4,575,814 | 3/1986 | Brooks, Jr. et al. | 364/900 |
| 4,628,254 | 12/1986 | Bristol | 324/77 R |
| 4,634,970 | 1/1987 | Payne et al. | 324/121 R |
| 4,641,246 | 2/1987 | Halbert et al. | 324/121 R |
| 4,647,862 | 3/1987 | Blair | 364/487 |
| 4,678,345 | 7/1987 | Agoston | 324/77 R |

OTHER PUBLICATIONS

Tektronix, "7612D Programmable Digitizer Operators Instruction Manual", 1st printing Jan. 1980; revised Jul. 1986; pp. 2-15 to 2-37 and pp. 5-4 to 5-5.
Tektronix, "7612D Programmable Digitizer Instruction Manual for Service Personnel", 1st printing Dec. 1982; revised Apr. 1987; pp. 1-4 to 2-5, and pp. 3-1 to 3-5.
Digital Processing Oscilloscope, © 1973; Tektronix, Inc. Product description publication, all pages [12/1978].
Advanced Digital Signal Analyzer Probes Low-Frequency Signals with Ease and Precision, by Richard C. Grote and H. Webber.
McKinney, Hewlett-Packard Company Journal (U.S.A.) Oct. 1977 all.
110 MHz Spectrum Analyser, Middleton et al., Marconi Instrumentation, vol. 14, No. 3, Nov. 1974, pp. 50-60.
Capture Fast Waveforms Accurately with a 2-Channel Programmable Digitizer, by Neil A. Robin and Bob Ramirez pp. 50-55, Electronic Design 3, Feb. 1, 1980.
Internal Computer Automates Oscilloscope, by David Rolfe, Electronic Product Design, Oct. 1980 pp. 45-48.

*Primary Examiner*—Parshotam S. Lall
*Assistant Examiner*—S. A. Melnick
*Attorney, Agent, or Firm*—Daniel J. Bedell

[57] ABSTRACT

A level detecting waveform digitizer for repetitively sampling an analog waveform and converting analog samples into representative digital data is provided with a predictive time base circuit for accurately controlling sample timing with respect to a triggering event in the input waveform and a comparator for indicating when the magnitude of the waveform as indicated by the digital data exceeds a predetermined level. The digitizer also includes a counter for counting samples taken and a second comparator for indicating when the sample count reaches a predetermined limit.

9 Claims, 6 Drawing Sheets

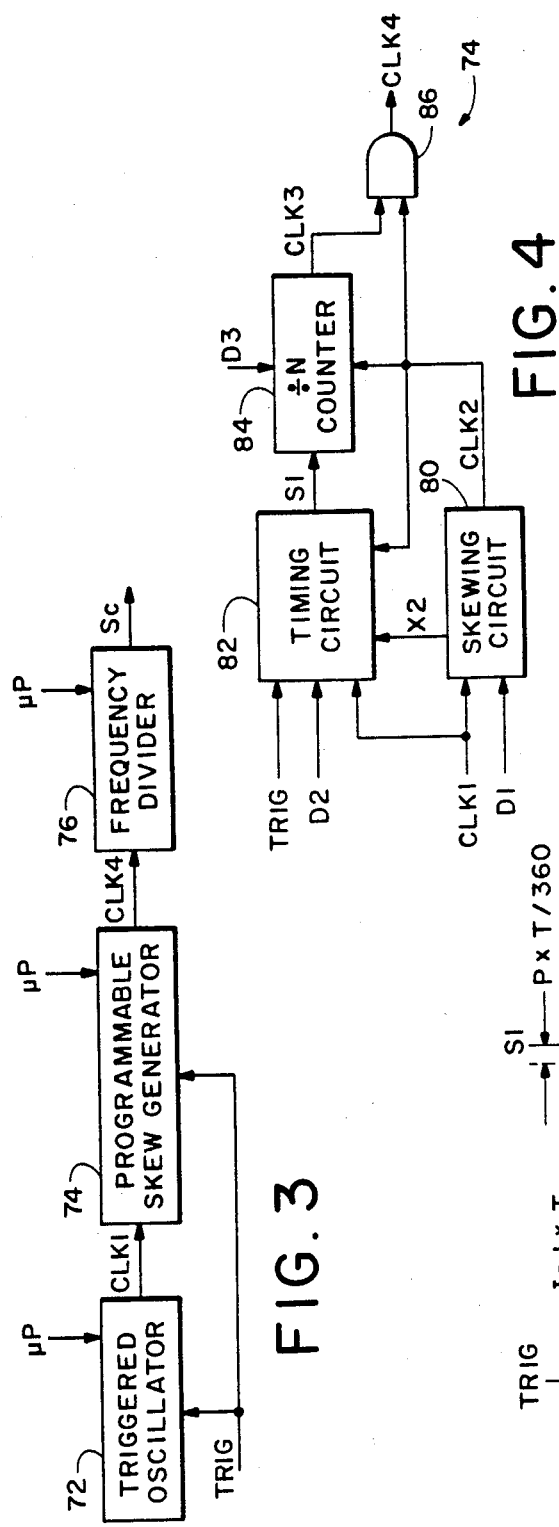
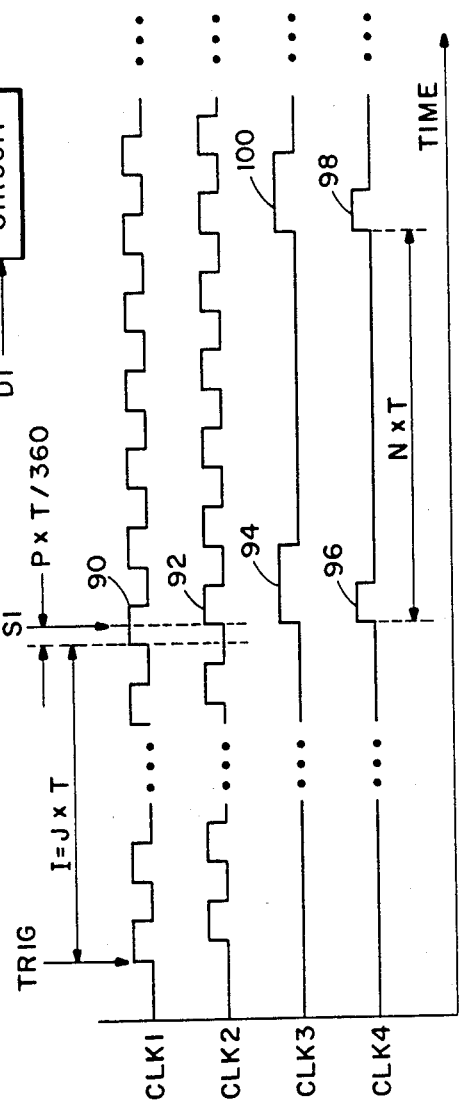

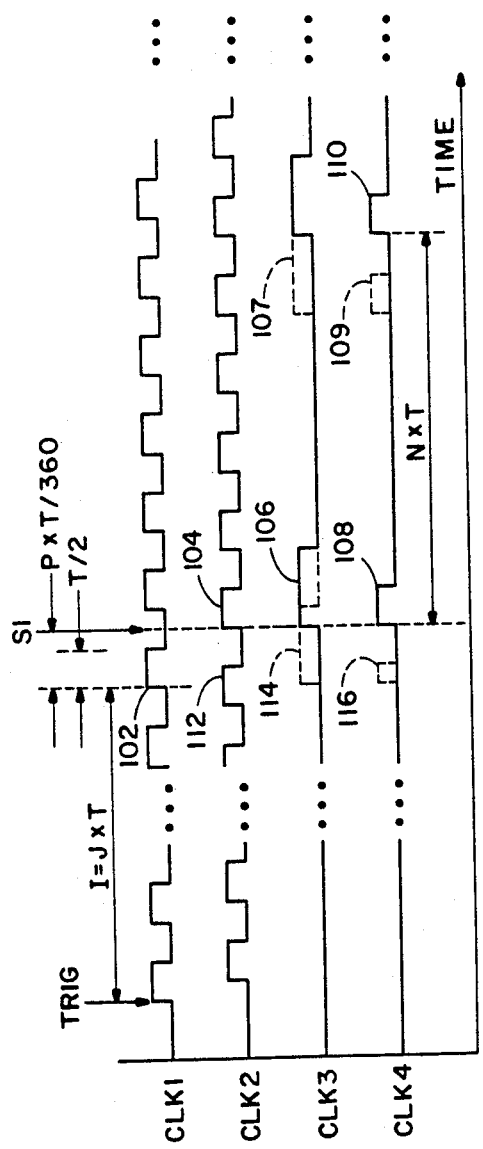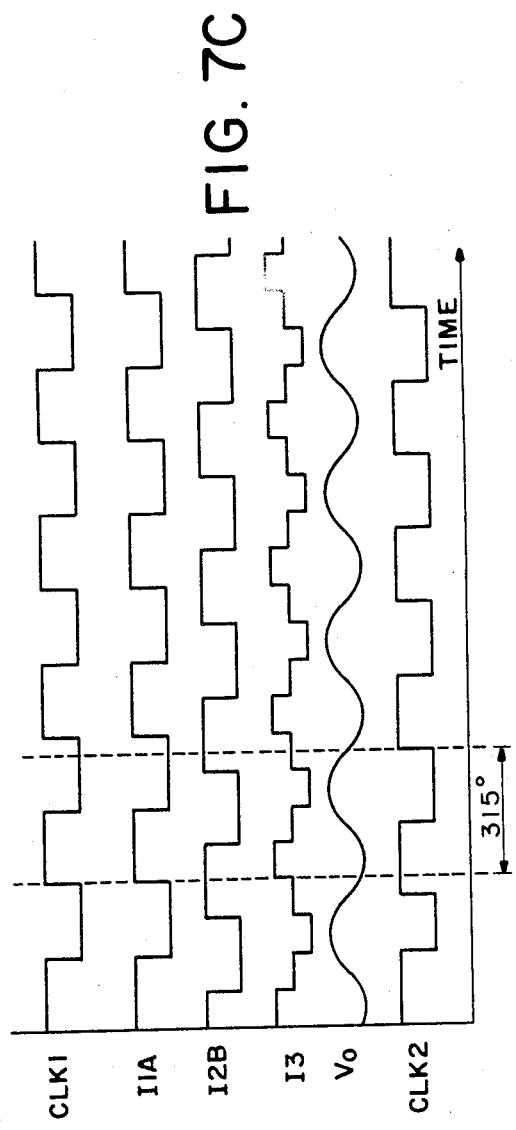

LEVEL DETECTING WAVEFORM SAMPLING SYSTEM

BACKGROUND OF THE INVENTION

The present invention relates in general to waveform sampling system and more particularly to a waveform sampling system for detecting when a waveform being sampled has reached a predetermined signal level.

Oscilloscopes utilizing waveform sampling systems were developed more than twenty years ago to respond to small, fast-changing signals to which conventional oscilloscopes could not respond due to limited bandwidth or risetime characteristics. Sampling is a now well-known technique wherein a signal path is gated for an extremely short period of time to pass the substantially instantaneous amplitude value (voltage sample) of an electrical signal during that period. Each voltage sample taken in this manner is digitized and stored as magnitude data in a memory. In a sampling oscilloscope the magnitude data for each sample normally controls the vertical positioning display of a dot on a cathode ray tube screen, the horizontal position of the dot being set according to the sample timing. If enough waveform samples are taken at closely timed intervals, the resulting displayed dots can form an accurate representation of the waveform. Sampling systems are characterized by the sample timing method utilized. Sequential sampling systems sample a waveform at regular intervals and the dots representing sample data are plotted at regular horizontal locations to accurately represent the waveform. Random sampling systems sample a waveform at random times but the random sampling intervals are measured during sampling to produce sample timing data used to appropriately adjust the horizontal positioning of the dots representing the waveform.

Waveform sampling systems can be utilized to measure the rise time of an input waveform, "rise time" normally being defined as the time required for the waveform voltage to rise from 10% of its maximum level to 90% of its maximum level. One method of determining a rise time is to search all of the magnitude data in the sampling system memory after sampling a waveform to determine which sample points are closest to the 10% and 90% magnitude levels. The rise time is then equal to the interval between the sampling times associated with the 10% and 90% data. However in random and sequential sampling systems it is difficult to ensure that samples will be taken at a time when the waveform was acceptably close to the 10% or 90% magnitude levels. While the sampling frequency of sequential sampling systems of the prior art can be precisely controlled, the relative timing of sampling with respect to a triggering event (such as a zero crossing) in the waveform cannot be precisely controlled. Therefore in order to ensure that samples will be taken at times when the waveform magnitude is acceptably close to the 10% and 90% levels in either random or sequential sampling systems, it would appear the waveform should be sampled at a high rate during a period of interest. Since the size of memory required to store the sample data increases with the number of samples taken, there are practical limits to the accuracy which can be obtained by increasing the sampling rate.

SUMMARY OF THE INVENTION

In accordance with one aspect of the invention, a waveform sampling system for periodically sampling an analog waveform and converting analog samples into representative digital data is provided with a predictive time base circuit for controlling sample timing, a counter for counting samples taken, and a comparator for indicating when the waveform sample magnitude indicated by the digital data exceeds a predetermined level. The predictive time base circuit permits accurate control not only over the frequency of periodic waveform sampling but also precise control over the time sampling begins following a triggering event, such as a zero crossing the waveform.

The sampling system utilizes an iterative method to determine a time interval between the triggering event and a point of interest along a periodic analog waveform at which the waveform magnitude reaches the predetermined level. During a first sampling iteration, the time base circuit is adjusted to begin sampling at a low frequency immediately after the triggering event and the counter counts the samples taken. When the comparator indicates that the magnitude of the sample data exceeds the predetermined level, sampling is halted. At this point the waveform point of interest is known to occur between the next-to-last and last sampling times, which are determined from the sample count. However, since the sampling frequency is low, the timing of the point of interest is only roughly known. The time base circuit is then adjusted to increase the sampling frequency and to delay initiation of sampling with respect to the triggering event until the time of the next-to-last sample. During a second sampling iteration, the waveform is sampled at the higher rate, and sampling is again terminated when the waveform level exceeds the predetermined limit. The timing of the point of interest is now more precisely known because the interval between the next-to-last and last sampling times is smaller due to the higher sampling frequency. Additional sampling iterations may be performed at still higher frequencies with the timing of the first sample being iteratively adjusted to be closer to the point of interest, until the timing of the point of interest with respect to the triggering event can be determined to fall within a short interval determined by the period of the highest sampling frequency at which the sampling system is capable of operating.

In accordance with another aspect of the invention, the sampling system also includes a second comparator for indicating when the sample count, which may be used to address a memory for storing sample data, reaches a predetermined limit. The second comparator, in conjunction with the first comparator and the predictive time base circuit, enables real time determination of whether an input waveform has reached a predetermined level within a predetermined time period with starting and ending points referenced to a triggering event in the waveform.

It is accordingly an object of the invention to provide an improved level detecting waveform digitizer for rapidly and accurately determining the time with respect to a triggering event in a waveform at which a waveform magnitude reaches a predetermined level.

It is another object of the invention to provide an improved level detecting waveform digitizer for rapidly determining whether a waveform magnitude has reached a predetermined level during a selected time interval relative to a triggering event in the waveform.

The subject matter of the present invention is particularly pointed out and distinctly claimed in the concluding portion of the specification. However, both the organization and method of operation, together with further advantages and objects thereof, may best be understood by reference to the following description taken in connection with accompanying drawings wherein like reference characters refer to like elements.

DRAWINGS

FIG. 3 is a block diagram of the programmable skew triggered oscillator of FIG. 2;

FIG. 4 is a block diagram of the programmable skew generator of FIG. 3;

FIGS. 5A and 5B are timing diagrams showing timing relationships between signals of the circuit of FIG. 4;

FIGS. 7A-7C are timing diagrams showing timing relationships between signals of the circuit of FIG. 6.

DETAILED DESCRIPTION

Figure 1:
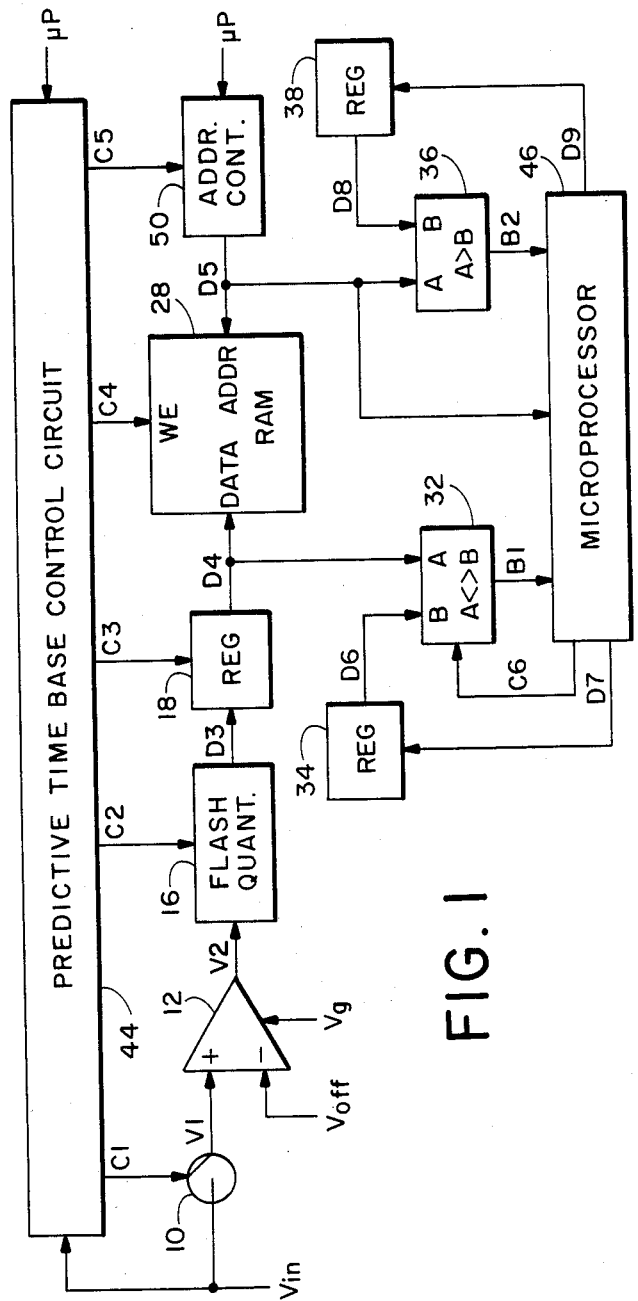
FIG. 1 is a block diagram of a level detecting waveform digitizer according to the present invention.

Referring to FIG. 1, there is depicted in block diagram form a level detecting waveform digitizer according to the present invention. The digitizer is adapted to sample and digitize an input waveform Vin and includes a sampling bridge 10 capable of repetitively sampling an input waveform Vin to reproduce a first sequence of sample output voltages V1, each voltage V1 having a magnitude substantially equal to the instantaneous magnitude of the input waveform. Each sample voltage V1 output of the sampling bridge 10 is applied to a non-inverting input of an amplifier 12, while an adjustable offset voltage Voff is applied to an inverting input of the amplifier. Amplifier 12 has an adjustable gain set according to an applied gain control voltage Vg. The output of amplifier 12 thus comprises a second sequence of voltages V2, each voltage V2 having a magnitude related to the magnitude of a corresponding voltage V1 of the first sequence by an adjustable offset and an adjustable gain. Each voltage V2 of the second sequence is applied as an input to a flash quantizer 16, an analog-to-digital converter adapted to convert the V2 voltage sequence into a third sequence of digital data D3, each data D3 comprising a 10-bit digital quantity representing the magnitude of a corresponding one of the voltages V2 of the second sequence. Each D3 data output of flash quantizer 16 is stored in a register 18 and then applied as input data D4 to a random access acquisition memory (RAM) 28.

Digitizer inaccuracies due primarily to inherent offsets and losses in the analog portion of the signal path up to the input of flash quantizer 16 are eliminated by calibration. The digitizer is calibrated by initially setting the offset voltage Voff input to amplifier 12 to an arbitrary value and applying a zero reference voltage as the input voltage Vin to the digitizer. The zero reference voltage is sampled and digitized with the resulting digital data D4 being stored in memory 28. If the digitized value D4 of the reference voltage is greater than zero, then Voff is increased, and if the digitized value is less than zero, Voff is decreased. This sampling and adjustment process may be repeated with the gain of amplifier 12 being increased by increasing Vg so that the value of Voff necessary to produce a zero value for data D4 can be finely adjusted. A nonzero reference voltage is then applied as the input voltage Vin to the digitizer and the reference voltage is again sampled and digitized with the resulting data D4 being stored in memory 28. If the stored digital representation of the sampled reference voltage indicates a voltage higher than the reference voltage, the gain of amplifier 12 is reduced by reducing the magnitude of Vg and if the digital representation of the sampled reference voltage indicates a voltage lower than the reference voltage, the gain of amplifier 12 is increased by increasing Vg. The sampling and adjustment process may be repeated to finely adjust the gain control voltage Vg until the digitized value of the sampled non-zero reference voltage is correct. Since the digitizer has a substantially linear response, calibration of the amplifier offset for zero input voltage and of the amplifier gain for a non-zero input voltage is sufficient to calibrate the digitizer for all input voltages within the linear response range of the digitizer.

The sample timing of sampling bridge 10 is controlled by a periodic strobe control signal C1 from a predictive time base control circuit 44. Circuit 44 also controls the timing of flash quantizer 16 with a signal C2, the input enabling of register 18 with a signal C3, and the write enabling of memory 28 with a write enabling signal C4. Various operating parameters of the time base control circuit 44, including sampling control signal C1 timing, are determined by control data from a microprocessor 46. A memory address control circuit 50, suitably comprising a programmable counter, produces address data D5 for addressing memory 28, the initial magnitude of D5 being controlled by data from microprocessor 46. During the waveform sampling process, the memory address control circuit 50 increments the address D5 on each receipt of a control signal C5 from the time base control circuit 44, the control signal C5 being derived from the write enable signal C4 so that the memory address is incremented each time new data D4 is stored in memory 28 so that the sequence of sample data D4 is stored at successive addresses in memory 28. The input waveform Vin can be displayed by plotting magnitude of the data stored in memory 28 at regular intervals, the intervals representing the period of the sampling control signal C1 applied to sampling bridge 10.

THe relative times at which a waveform magnitude reaches a selected level is often of interest. For instance one common measure of the response of an amplifier is the rise time of a square wave output of the amplifier, i.e., the time required for the square wave to rise from 10% to 90% of its peak magnitude. To facilitate determination of the relative timing of waveform magnitude levels, the digitizer of the present invention includes a comparator 32 for indicating when the waveform sample magnitude indicated by the digital data D4 input to memory 28 rises above (or falls below) a predetermined level indicated by digital data D6 stored in a register 34. The comparator 32 includes an input A for receiving sample data D4, an input B for receiving limit data D6, and an output A< >B for producing a binary signal B1 indicating when the A input data rises above or falls below the B input. In a first operating mode, comparator 32 drives output B1 high when input A rises above its input B and in a second operating mode comparator 32 drives output B1 high when input A falls below input B. A control signal C6 from microprocessor 46 determines the comparator mode of operation. The microprocessor 46 also provides limit data D7 as input to register 34 for storage as data D6 prior to digitizer operation.

The digitizer utilizes an iterative method to determine a time interval between a triggering event in the input waveform Vin and a point of interest along an analog waveform wherein the waveform magnitude reaches the predetermined level indicated by limit data D6. The predictive time base circuit 44 permits accurate control not only ever the sample frequency but also over when the time periodic sampling begins following the triggering event. During a first sampling iteration, the time base circuit 44 is adjusted to initiate a periodic sampling control signal C1 of a precisely determined low frequency immediately after a triggering event (such as a zero crossing) in input waveform Vin, Vin being applied as an input to the time base circuit 44 as well as to sampling bridge 10. The microprocessor preloads the address control circuit 50 with data indicating the initial memory address at which the first sample data is to be stored in memory 28. The address control circuit 50 increments the current memory address each time data is stored in memory 28. When the comparator 32 output B1 indicates to the microprocessor 46 that the magnitude of the sample data rises above (or falls below ) a level determined by data D6 from register 34, the microprocessor reads the current addressing data D5 output of address counter 50. At this point the microprocessor 46 knows that the waveform point of interest occurred between the next-to-last and last samples and the microprocessor determines the last sampling time by subtracting the memory address of the first sample point from the last data D5 address and multiplying the result by the known period of the sampling control signal C1. The sampling time of the next-to-last sample point is determined by subtracting one period of the C1 signal from the sampling time calculated for the last sample point. However, since the sampling frequency is low, the timing of the point of interest is only roughly known because the last and next-to-last sample times bound a relatively large time interval.

Prior to a second sampling iteration, the microprocessor 46 adjusts the time base control circuit 44 so that it initiates the sampling control signal C1 at the time relative to the triggering event of the next-to-last sampling point taken during the previous sampling iteration. The microprocessor 46 also instructs time base control circuit 44 to increase the frequency of C1 such that waveform samples are taken more frequently. A second sampling iteration is then performed and the microprocessor 46 again reads the current addressing data D5 when the comparator 32 output B1 indicates the magnitude of the input waveform Vin has reached the limit determined by data D6. The microprocessor 46 again determines from data D6 and the period of signal C1 an interval bounding the point of interest. However since the sampling rate is higher the interval bounding the point of interest is shorter and the relative timing of the point of interest can be determined with greater accuracy than at the end of the first sampling iteration. Microprocessor 46 may initiate additional sampling iterations performed at still higher frequencies with the timing of the first sample being iteratively adjusted to be progressively closer to the point of interest, until the timing of the point of interest with respect to the triggering event can be accurately determined because it falls within a very short interval determined by the period of the highest sampling frequency at which the sampling system is capable of operating.

Thus the comparator 32 enables the digitizer of the present invention to accurately determine a time interval between a triggering event in the waveform and the moment the input waveform reaches a predetermined high or low level without having to search data stored in memory 28. To determine an input voltage Vin rise time, the level detecting method can be employed twice, with the data in register 34 being initially set to reflect a 10% waveform magnitude and being later set to reflect a 90% peak magnitude, the time intervals measured during the two iterative level detecting operations being differenced to compute the rise time.

One may initially wish to know whether the waveform Vin reaches a predetermined high or low magnitude level during a particular interval of interest with respect to a triggering event in the input waveform. Accordingly the digitizer of the present invention is also provided with a second comparator 36 which compares the address data D5 applied to an input A of comparator 36 to address limit data D8 applied to a B comparator input and transmits a binary indicating signal to microprocessor 46 when the magnitude of the A input exceeds the magnitude of the B input. The D8 limit data is provided by the contents of another register 38 which is preloaded by data D9 from microprocessor 46.

To determine whether the waveform Vin reaches a predetermined high or low magnitude level during a particular period of interest with respect to a triggering event in the input waveform, microprocessor 46 initially adjusts time base control circuit 44 so that it initiates the periodic sampling control signal at the beginning of the period of interest (i.e., at the end of a predetermined time interval following a triggering event in the waveform). The microprocessor also sets data D8 in register 38 to match the address D5 which would be produced at the end of the sampling period, and sets data D6 in register 34 to indicate the magnitude of interest. After sampling begins the microprocessor 46 monitors the indicating signals B1 and B2. If B1 occurs before B2, then the microprocessor 46 knows that the input waveform Vin reached the predetermined level during the period of interest.

The previously described iterative level detection method requires that the microprocessor 46 have precise control over sampling times with respect to repetitive triggering events in the waveform being sampled. Such sample timing control is provided by the time base control circuit 44, depicted in more detailed block diagram form in FIG. 2. Sampling bridge 10 of the digitizer samples the Vin input signal when it is strobed with a short pulse C1 from a strobe generator 52. Strobe generator 52 produces strobe pulses in response to a square wave sampling control output signal Sc from a triggered, programmable skew oscillator 54, the frequency of the square wave sampling control signal being determined by data from the microprocessor 46 of FIG. 1. The output signal of the oscillator 54 is triggered by a triggering signal from a trigger generator 55 which monitors the Vin signal and transmits a triggering signal to oscillator 54 on detection of a triggering event (such as a zero crossing) in Vin, the nature of the triggering event being defined by data from the microprocessor 46.

While the output signal of oscillator 54 is initiated by the triggering signal, it is delayed following the triggering signal by a delay time interval determined according to timing data provided to oscillator 54 by the microprocessor 46 of FIG. 1. Thus the first sampling point along each repetitive waveform section of the Vin signal occurs at the end of a time interval of programmably determined duration following the triggering event. Since the oscillator 54 output signal is periodic, the waveform section is sampled periodically after the first sample is taken. The output signal of oscillator 54 is also delayed by a multiple tap delay line 59, successive taps of the delay line providing enabling signals C2-C5 to the flash quantizer 16, register 18, memory 28, and address control circuit 50 of the digitizer.

Figure 2:
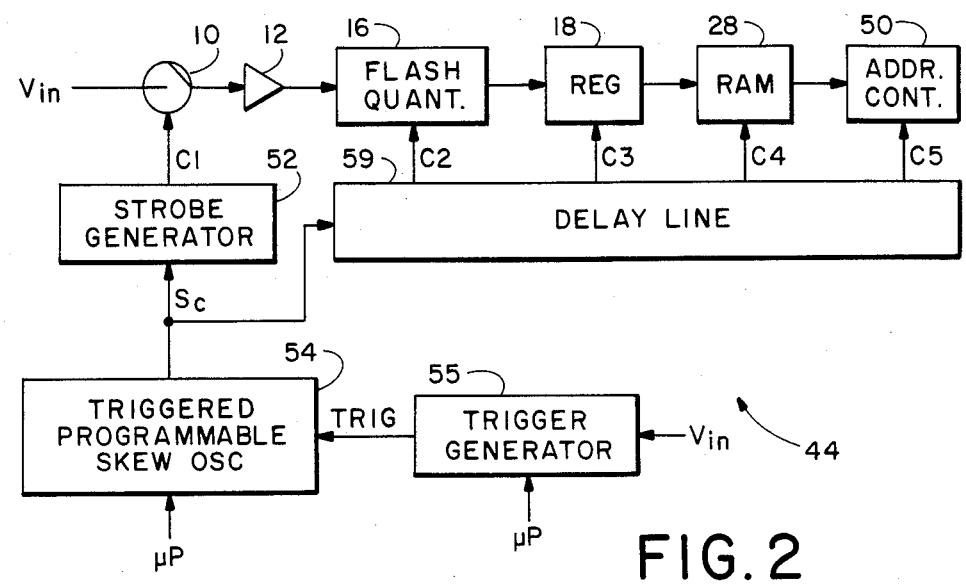
FIG. 2 is a block diagram of the time base control circuit of FIG. 1 according to the preferred embodiment of the present invention.

The block components of the time base control circuit 44 (other than the oscillator circuit 54) are common devices, well known in the art, and are not further detailed herein. Referring to FIG. 3, the oscillator circuit 54, depicted in more detailed block diagram form, includes a triggered oscillator 72, a programmable skew generator 74, and a programmable frequency divider 76. The triggering signal from trigger generator 55 of FIG. 2 is applied to oscillator 72 which initiates a 100 MHz square wave output signal CLK1 on receipt of the triggering signal. The oscillator 72 output signal is applied to skew generator 74 which initiates a 20 MHz output signal CLK4 following receipt of the triggering signal, delayed by a delay time determined by timing data provided by the microprocessor. The 20 MHz skew generator output signal CLK4 provides an input to the frequency divider 76 which generates the strobe control signal Sc input to the strobe generator 52 of FIG. 2. The frequency of the strobe control output signal is selected by frequency divider 76 which divides The 20 MHz input signal from skew generator 74 by an amount determined by data provided by the microprocessor 46 of FIG. 1. Devices capable of performing the functions of the triggered oscillator 74 and the frequency divider 76 are well known in the art and are not further detailed herein.

Referring to FIG. 4, a preferred embodiment of the programmable skew generator 74 of FIG. 3, depicted in more detailed block diagram form, comprises a skewing circuit 80, a timing circuit 82, a divide-by-N counter 84 and an AND gate 86. The skewing circuit 80 generates a square wave output signal CLK2 which is of the same frequency, 100 MHz, as the output signal CLK1 of the triggered oscillator 72 of FIG. 5, CLK1 being applied as a reference clock to the skewing circuit. While CLK1 and CLK2 are of the same frequency, the skewing circuit output signal CLK2 lags CLK1 by a phase angle ranging from 0 to 360 degrees as determined by applied phase angle data D1 from the microprocessor 46 of FIG. 1.

The reference signal CLK1 is also input to timing circuit 82 along with the CLK2 signal and the triggering signal TRIG which initiated the reference clock signal CLK1 and which therefore coincides with the leading edge of the first pulse of the CLK1 signal. Timing circuit 82 produces an enabling signal S1 on the leading edge of the first CLK2 pulse occurring after the end of a predetermined time interval following the triggering signal. The duration of this time interval is determined according to timing data D2 applied as input to the timing circuit 82 from the microprocessor 46 of FIG. 1 and according to the state of a binary control signal X2 produced by the skewing circuit 80. Data D2 indicates a time (J×T) in terms of an integer number J of reference clock CLK1 cycles of period T, T being 10 nsec for the 100 MHz CLK1 signal. The state of the binary control signal X2 is determined according to the magnitude of the phase shift between CLK1 and CLK2. Timing circuit 82 adjusts the time interval for delaying S1 either to J×T seconds or to (J×T)+(T/2) seconds, the additional T/2 seconds being included in the interval if the X2 signal indicates that the phase shift between CLK1 and CLK2 is to exceed 180 degrees.

The enabling signal S1 count enables the divide-by-N counter 84 which counts pulses of the clock signal CLK2 from the skewing circuit 80. Counter 84 produces an output pulse when count enabled and thereafter produces an additional output pulse each time it counts N subsequent pulses of clock signal CLK2, where N is determined according to control data D3 from microprocessor 46. In this application, where the clock signal CLK2 has a 100 MHz frequency and a 20 MHz skew generator output signal is required, N is set to 5 such that the frequency of the output signal CLK3 produced by the divide-by-N counter 84 is 20 MHz. The signals CLK2 and CLK3 are applied as inputs to the AND gate 86 which produces the 20 MHz output clock signal CLK4 of the skew generator.

The timing relationships of the CLK1, CLK2, CLK3 and CLK4 signals when the phase shift P between CLK1 and CLK2 is less than 180 degrees are illustrated in the timing diagram of FIG. 5A. When the phase shift P between CLK1 and CLK2 is less than 180 degrees, X2 is of a state wherein the additional T/2 seconds are not included in the time interval I following the triggering signal TRIG. Since the enabling signal S1 occurs on the leading edge of first CLK2 pulse (pulse 92) after the end of interval I, the time interval between TRIG and S1 is therefore J×T seconds plus an additional amount of time (P×T/360 seconds) due to the phase difference between the leading edge of the Jth CLK1 pulse 90 and the corresponding CLK2 pulse 92. CLK2 pulse 92 causes the divide-by-N circuit to initiate the first CLK3 pulse 94. The AND gate 86 of FIG. 4 then combines this CLK2 pulse 82 and first CLK3 pulse 94 to produce the first CLK4 pulse 96. The next CLK4 pulse 98 is produced N cycles of the CLK2 signal later, coincident with the next CLK3 pulse 100. Thus the first CLK4 pulse 96 occurs (J×T)+(P×T/360) seconds after the triggering signal TRIG and subsequent CLK4 pulses occur every N×T seconds thereafter.

The timing relationships between CLK1, CLK2, CLK3 and CLK4 when the phase shift P between CLK1 and CLK2 is greater than 180 degrees are illustrated in the timing diagram of FIG. 5B. When the phase shift P between CLK1 and CLK2 is greater than 180 degrees, the state of signal X2 is set such that the time interval I following the triggering signal TRIG is set to (T×J)+(T/2) seconds. The enabling signal S1 occurs on the leading edge of the next CLK2 pulse 104, or (P×T/360)−(T/2) seconds after the end of interval I. This CLK2 pulse 104 causes the divide-by-N circuit to initiate the first CLK3 pulse 106 which AND gate combines with CLK2 pulse 104 to form the first CLK4 pulse 108. The next CLK4 pulse 110 is produced N×T seconds later. Thus, as in the case when P is less than 180 degrees, the first CLK4 pulse 108 occurs J×T+P×T/360 seconds after the triggering signal T and subsequent CLK4 pulses occur every N×T seconds thereafter. The extra half cycle is introduced into interval I when the phase angle between CLK1 and CLK2 is greater than 180 degrees because without the extra half cycle delay, the CLK2 pulse 112 preceding pulse 104 would prematurely trigger a CLK3 pulse 114 (shown in dotted line) which would in turn cause the AND gate to prematurely produce a CLK4 pulse 116 (also shown in dotted line). Also, subsequent CLK3 and CLK4 clock pulses 107 and 109 (shown in dotted line) would occur prematurely.

From FIGS. 5A and 5B it can be seen that regardless of the magnitude of the phase shift between CLK1 and CLK2, the time delay between the triggering signal TRIG and the first CLK4 pulse is $(J \times T)+(P \times T/360)$ seconds and the interval between each subsequent CLK4 pulse is $N \times T$ seconds. Since the magnitude of P, J and N are functions of data D1, D2 and D3 from the microprocessor 46 of FIG. 1, the timing of the first CLK4 pulse and the frequency of occurrence of each CLK4 pulse thereafter are completely predictable and controllable with an accuracy determined primarily by the ability of the skewing circuit 80 to accurately adjust the phase angle difference between CLK1 and CLK2.

Figure 6:
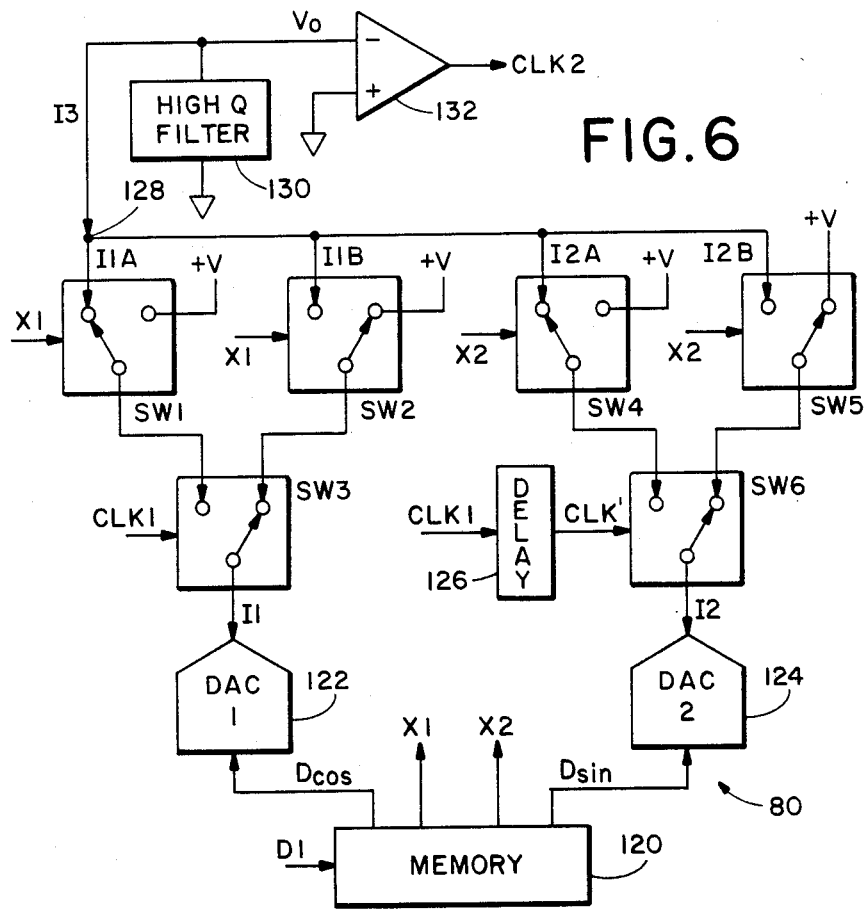
FIG. 6 is a block diagram of the skewing circuit of FIG. 4.

Referring to FIG. 6, the skewing circuit 80 of FIG. 4, depicted in block diagram form, includes a memory 120 addressed by the phase angle data D1. When D1 is set to represent a desired phase angle (from 0 to 360 degrees) between the CLK1 and CLK2 signals, memory 120 outputs data at the addressed storage location corresponding to the desired phase angle, including data Dcos and Dsin and binary bits X1 and X2. The magnitude of data Dcos is proportional to the absolute value of the cosine of the desired phase angle and the magnitude of data Dsin is proportional to the absolute value of the sine of the phase angle. Bits X1 and X2 comprise binary control signals which are high or low depending on the quadrant of the desired phase angle according to the following Table I:

TABLE I

| Quadrant | Phase Angle | X1 | X2 |
|---|---|---|---|
| First | 0 to 90 | 0 | 0 |
| Second | 90 to 180 | 1 | 0 |
| Third | 180 to 270 | 1 | 1 |
| Fourth | 270 to 360 | 0 | 1 |

It is noted that the X2 signal is high whenever the phase angle exceeds 180 degrees as required for proper operation of the timing circuit 82 of FIG. 4.

The data Dcos output of memory 120 provides an input to a first digital to analog converter 122 which acts as a constant current source, drawing a current I1 of magnitude proportional to the magnitude of Dcos. Data Dsin is applied as the digital input to a second digital to analog converter 124 which also acts as a constant current source, drawing a current I2 of magnitude proportional to the magnitude of Dsin.

The skewing circuit 80 also includes a set of six electronic switches SW1–SW6. The switching states of switches SW1 and SW2 are controlled by the X1 signal produced by memory 120 and the switching states of switches SW4 and SW5 are controlled by the X2 signal. The switching state of SW3 is controlled by the reference clock signal CLK1 while the switching state of switch SW6 is controlled by an output signal CLK1' of a delay circuit 126 which produces the CLK1' signal by delaying the CLK1 signal by one quarter of a CLK1 period, or 2.5 nsec for a 100 MHz CLK1 signal. The current I1 of converter 122 is drawn from switch SW3 which in turn obtains the current from switch SW2 when CLK1 is low and from SW1 when CLK1 is high. The current I2 to converter 124 is provided by switch SW6 which draws current I2 from switch SW5 when CLK1' is low and from switch SW4 when CLK1' is high.

Switch SW1 acquires current I1 from a node 128 (as a current I1A) when X1 is low and from a source of positive voltage +V when X1 is high, while switch SW2 draws I1 (as a current I1B) from node 128 when X1 is high and from +V when X1 is low. Similarly, switch SW4 draws I2 from node 128 (as current I1C) when X2 is low and from +V when X2 is high and switch SW5 obtains current I21 from node 128 (as current I1D) when X2 is high and from +V when X2 is low. A current I3 into node 128, resulting from the combination of I1A, B, I2A, and I2C currents from node 128 into switches SW1, SW2, SW4, and SW5, is obtained from ground through a 100 MHz, high Q filter 130. The voltage Vo developed across filter 130 in response to current I3 is applied to an inverting input of a comparator 132 while a non-inverting input of the comparator is connected to ground.

Figure 7A:
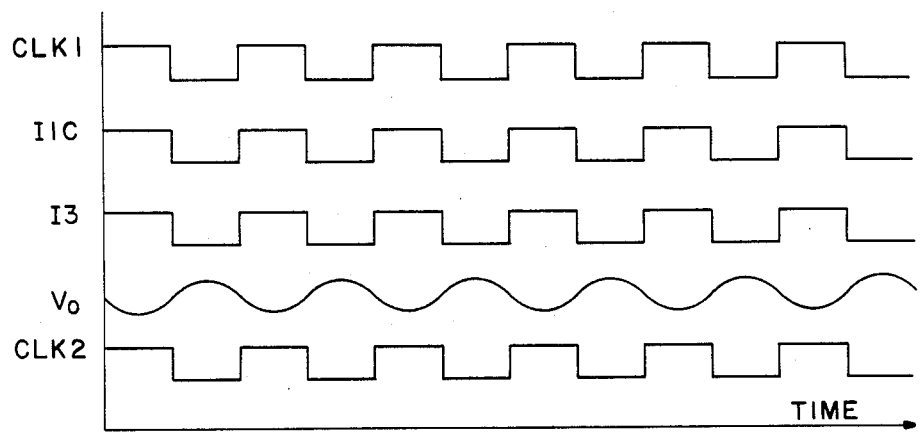

The operation of skewing circuit 80 is described with reference to FIG. 6 and to the timing diagrams of FIGS. 7A–7C which illustrate examples of the time varying behavior of the relevant signals of FIG. 6 when the desired phase angle between CLK1 and CLK2 is 0, 45 and 315 degrees, respectively. FIG. 7A illustrates the operation of skewing circuit 80 when the phase angle indicated by data D1 is 0 degrees. In such case X1 and X2 are both low causing switches SW1 and SW4 to draw currents I1A and I2A from node 128. The magnitude of data Dcos produced by memory 120 is 1, the absolute value of the cosine of 0, and therefore the current I1 has a maximum value, for instance 100 mA. Switch SW3 draws current I1 through switch SW1 during the high state portion of each CLK1 cycle and therefore current I1A appears as a square wave in phase with CLK1. The magnitude of data Dsin, equal to the absolute value of the sine of zero degrees, is 0 and therefore currents I2 and I2A are zero at all times. Thus only current I1A contributes to current I3. The voltage Vo developed across filter 130 appears as a sine wave oscillating about 0 potential producing a square wave comparator 132 output signal CLK2 in phase with CLK1.

Figure 7B:
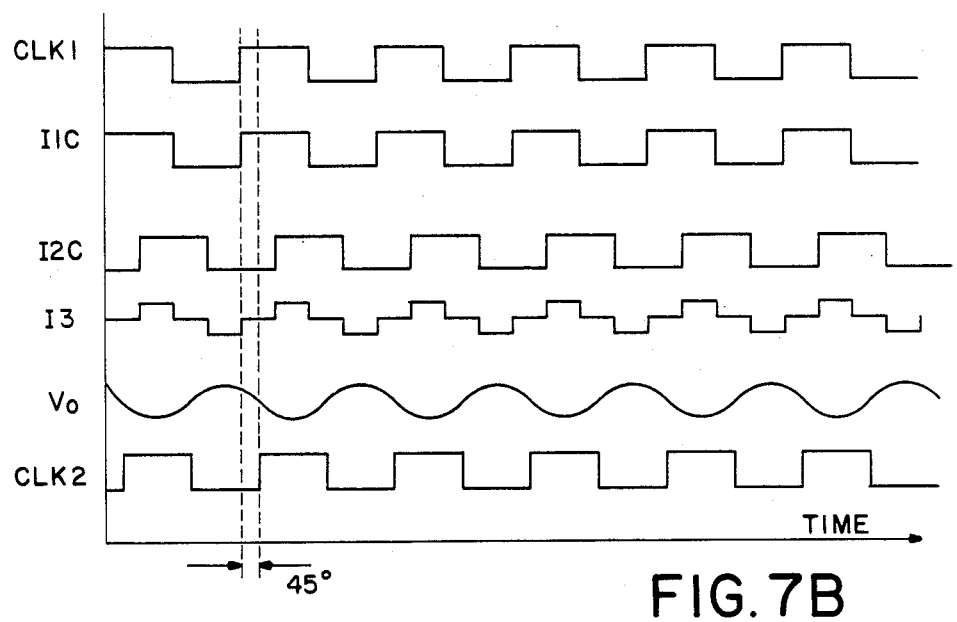

FIG. 7B illustrates the operation of skewing circuit 80 when the phase angle indicated by data D1 is 45 degrees. Again, according to Table 1, X1 and X2 are both low such that switches SW1 and SW4 draw currents I1A and I2A from node 128 but the magnitude of Dcos produced by memory 120 is 0.707, the absolute value of the cosine of 45 degrees. Therefore the current I1 has a Magnitude of 0.707 of maximum, for instance 70.7 mA. Switch SW3 draws current I1 through switch SW1 during the high state portion of each CLK1 cycle and therefore current I1A appears as a square wave in phase with CLK1. The magnitude of Dsin, equal to the sine of 45 degrees, is also 0.707 of maximum. Switch SW6 draws current I2 through switch SW4 during the high state portion of each CLK1' cycle such that current I2A appears as a square wave lagging CLK1 by 90 degrees. Currents I1B and I2B are zero at all times. Currents I1A and I2A combine to form current I3. Current I3 and the sine wave voltage Vo developed across filter 130 resulting from current I3 are shown in FIG. 10B. Voltage Vo causes comparator 132 to produce a square wave CLK2 output lagging CLK1 by 45 degrees. When the phase angle is another value between 0 and 90 degrees, the operation of the skewing circuit is similar except the relative values of currents I1 and I2 differ, with I2 increasing and I1 decreasing as the phase angle is increased from 0° to 90°. This causes the sine wave Vo to shift to the right as the phase angle indicated by D3 increases, thereby increasing the phase angle between the leading edges of CLK1 and CLK2 pulses in proportion to the phase angle data D1.

FIG. 7C illustrates the operation of skewing circuit 80 when the phase angle set by data D1 is 315 degrees. According to Table I, X1 is low and X2 is high such that switches SW1 and SW5 draw currents I1A and I2B from node 128. The magnitude of Dcos produced by memory 120 is 0.707, i.e., the absolute value of the cosine of 315 degrees, and therefore the current I1 has a magnitude of 0.707 of maximum. Switch SW3 draws current I1 through switch SW1 during the high state portion of each CLK1 cycle such that current I1A appears as a square wave in phase with CLK1. The magnitude of Dsin, equal to the absolute value of the sine of 315 degrees, is also 0.707 of maximum. Switch SW6 draws current I2 through switch SW5 during the low state portion of each CLK1' cycle, with current I2B appearing as a square wave lagging CLK1 by 270 degrees. Currents I1B and I2A are zero at all times. Current I1A and I2B combine to form current I3. Current I3 and the sine wave voltage Vo developed across comparator 132 resulting from current I3 are shown in FIG. 7C. The voltage Vo causes comparator 132 to produce a square wave CLK2 output which lags CLK1 by 315 degrees.

Thus the skewing circuit 80 permits the phase difference between CLK1 and CLK2 to be adjusted from 0 to 360 degrees. The resolution of the adjustment depends on the resolution of digital to analog converters 122 and 124 and on the size of data Dcos and Dsin which can be stored in memory 120.

Figure 8:
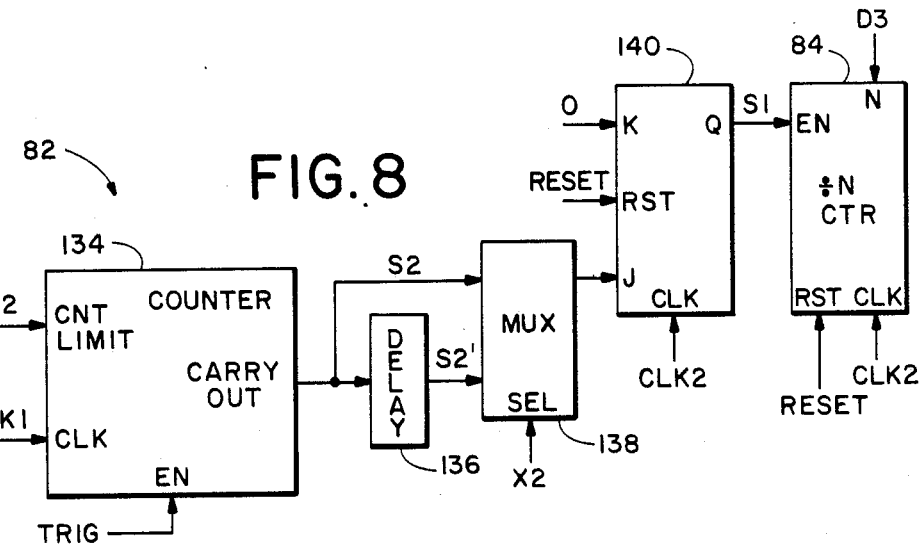
FIG. 8 is a block diagram of the timing circuit of FIG. 4.

Referring to FIG. 8, the timing circuit 82 of FIG. 6, depicted in more detailed block diagram form, comprises a pulse counter 134, a delay circuit 136, a multiplexer 138, and a J-K flip-flop 140. Counter 134 counts pulses of the CLK1 signal applied to a clock input and produces an output signal S2 when the clock pulse count reaches a count limit determinated by data D2 applied to a count limit input of counter 134. The counter 134 is enabled by the TRIG signal. The S2 signal is directly applied to one input of the multiplexer 138 while being indirectly applied to another input of the multiplexer through a delay circuit 136 which delays signal S1 by one fourth of a CLK1 period, or 2.5 nsec for a 100 MHz CLK1 signal. The switching state of multiplexer 138 is controlled by the X2 signal from skewing circuit 80 of FIG. 6, and the output of multiplexer 138, either S2 (when X2 is low) or the output S2' of delay circuit 136 (when X2 is high), drives the J input of flip-flop 140. A logic level 0 drives the K input of flip-flop 140 with the CLK2 signal driving the clock input of the flip-flop. The S1 enabling signal is developed at the Q output of the flip-flop and this signal input enables the divide-by-N counter 84.

After the TRIG signal enables counter 134, the counter begins counting CLK1 pulses until the count limit J determined by data D2 is reached. At this point the counter produces the S2 signal which is passed either directly or in delayed form S2' to the J input of flip-flop 140 via multiplexer 138 so that flip-flop 140 sets on the next CLK2 pulse to produce the S1 enabling signal at its Q output. When signal generation by the skewing circuit is terminated the flip-flop 140 and divide-by-N counter 84 are reset by a reset signal from the microprocessor.

Thus the predictive time base circuit 44 of FIG. 1 is adapted to provide control over sampling of an input waveform, including control not only over the frequency of sampling but also precise control over the time at which periodic sampling of a waveform begins with respect to a triggering event in the waveform. The use of this predictive time base circuit in combination with the use of comparator 32 FIG. 1 enables the waveform digitizer of the present invention to rapidly and accurately determine the time with respect to a triggering event in a waveform at which a waveform magnitude reaches a predetermined level. In addition the use of comparator 36 of FIG. 1 also enables the waveform digitizer of the present invention to rapidly determine whether a waveform magnitude has reached a predetermined level during a time interval relative to a triggering event in the waveform.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:
1. A level detecting waveform digitizer comprising:
  a time base circuit for producing a periodic sampling control signal of adjustable frequency commencing at the end of an adjustable, predetermined time interval following an occurrence of a triggering event in a waveform;
  means responsive to said sampling control signal for producing analog samples representative of the magnitude of the waveform at the end of said adjustable predetermined time interval and at regular intervals thereafter;
  means for converting said analog samples into representative digital sample data;
  means for generating an indicating signal when the magnitude of the digital sample data passes a first predetermined limit; and
  means for adjusting said time interval and said frequency of said periodic sampling control signal following generation of said indicating signal and for causing said time base circuit thereafter to generate an adjusted sampling control signal following another occurrence of the triggering event.
2. The level detecting waveform digitizer according to claim 1 further comprising:
  an addressable memory for storing said digital sample data;
  means responsive to said sampling control signal for generating address data for addressing said addressable memory, said address data being incremented in response to said sampling control signal; and
  means for indicating when the address data reaches a second predetermined limit.
3. A level detecting waveform digitizer comprising:
  a time base circuit for producing a periodic sampling control signal of adjustable frequency commencing at an end of an adjustable predetermined time interval following a triggering event in a waveform;
  means responsive to said periodic sampling control signal for producing a sequence of analog samples representative of the magnitude of the waveform at the end of the predetermined time interval and at regular intervals thereafter;

means for converting each of said analog samples into representative digital sample data; and means for generating an indicating signal when the magnitude of the digital sample data passes a first predetermined limit.

4. The level detecting waveform digitizer according to claim 3 further comprising:

means for providing a count of analog samples produced, said count representing a time in number of sampling control signal periods since commencement of said periodic sampling control signal; and means for indicating when said count exceeds a second predetermined limit.

5. The level detecting waveform digitizer according to claim 3 wherein said time base circuit comprises:

a trigger generator for generating a triggering signal in response to said triggering event;

a triggered oscillator responsive to said triggering signal for generating a first periodic clock signal of constant frequency commencing upon generation of said triggering signal;

a skewing circuit responsive to first first periodic clock signal for generating a second periodic clock signal, said second periodic clock signal being phase skewed from said first periodic clock signal by an adjustable phase angle;

a timing circuit responsive to said triggering signal for generating an enabling signal after a time interval of adjustable duration following said triggering signal;

a frequency divider responsive to said enabling signal for dividing said second periodic clock signal frequency by a predetermined amount following generation of said enabling signal thereby to produce a third periodic clock signal; and means for generating said sampling control signal in response to said third periodic clock signal.

6. A level detecting waveform digitizer comprising:

a time base circuit for generating a periodic sampling control signal of adjustable frequency commencing at a predetermined time with respect to a triggering event in a waveform;

means responsive to said periodic sampling control signal for producing analog samples representative of the magnitude of the waveform at the predetermined time and at regular intervals thereafter;

means for converting said analog samples into representative digital sample data;

means for generating a first indicating signal when the magnitude of the digital sample data passes a first predetermined limit;

means responsive to said sampling control signal for generating address data, said address data being sequenced in response to said periodic sampling control signal;

an addressable memory, addressed by said address data, for storing said digital sample data; and means for generating a second indicating signal when the magnitude of the address data exceeds a second predetermined limit.

7. The level detecting waveform digitizer according to claim 6 wherein said time base circuit comprises:

a trigger generator for generating a triggering signal in response to said triggering event;

a triggered oscillator responsive to said triggering signal for generating a first periodic clock signal of constant frequency commencing upon generation of said triggering signal;

a skewing circuit responsive to said first periodic clock signal for generating a second periodic clock signal, said second periodic clock signal being phase skewed from said first periodic clock signal by an adjustable phase angle;

a timing circuit responsive to said triggering signal for generating an enabling signal after a time interval of adjustable duration following said triggering signal;

a frequency divider responsive to said enabling signal for dividing said second periodic clock signal frequency by a predetermined amount following generation of said enabling signal thereby to produce a third periodic clock signal; and means for generating said sampling control signal in response to said third periodic clock signal.

8. A method for determining a first time interval between a triggering event in a waveform and the moment that the magnitude of the waveform obtains a predetermined limit, the method comprising the steps of:

generating a periodic sampling control signal of a known frequency commencing at the end of an adjustable predetermined second time interval following a triggering even in a waveform;

sampling the waveform in response to each period of said periodic sampling control signal to produce a sequence of analog waveform samples representative of the magnitude of the waveform at the end of said predetermined second time interval and at regular intervals thereafter;

converting each said analog waveform sample into representative digital sample data;

generating an indicating signal when the digital sample data passes a predetermined limit;

providing a count of analog waveform samples produced; and ascertaining the magnitude of said first time interval from the magnitude of said count at the moment said indicating signal is generated, from the frequency of the periodic sampling control signal, and from the duration of the second time interval.

9. A method for determining a first time interval between a periodically occurring triggering event in a periodic waveform and the moment that the magnitude of the periodic waveform obtains a predetermined limit, the method comprising the steps of:

a. generating a first periodic sampling control signal of a known first frequency commencing at the end of a predetermined second time interval following the triggering even in the periodic waveform;

b. sampling the periodic waveform in response to each period of said first periodic sampling control signal to produce a first sequence of first analog waveform samples representative of the magnitude of the periodic waveform at the end of said predetermined second time interval and at regular intervals thereafter;

c. converting each first analog waveform sample into representative first digital sample data;

d. generating a first indicating signal when a first digital sample datum passes a predetermined limit;

e. providing a first count of first analog waveform samples produced prior to generation of said first indicating signal;
f. ascertaining a third time interval representative of a time between said triggering event and generation of said indicating signal, said third time interval being ascertained in accordance with a function of the magnitude of the first count, the first frequency and the duration of the second time interval;
g. generating a second periodic sampling control signal of a known second frequency, said second frequency being higher than said first frequency, said second periodic sampling control signal commencing at the end of said ascertained third time interval following said triggering event;
h. sampling the periodic waveform in response to each period of said second periodic sampling control signal to produce a second sequence of second analog waveform samples representative of the magnitude of the periodic waveform at the end of said third time interval and at regular intervals thereafter;
i. converting each said second analog waveform sample into representative digital sample data;
j. generating a second indicating signal when a second digital sample datum passes said predetermined limit;
k. providing a second count of second analog waveform samples produced prior to generation of said second indicating signal; and
l. ascertaining a second magnitude of said first time interval from the magnitude of said second count, the second frequency and the duration of the third time interval.

* * * * *